United States Patent
Plano et al.

[11] Patent Number: 5,607,723
[45] Date of Patent: *Mar. 4, 1997

[54] METHOD FOR MAKING CONTINUOUS THIN DIAMOND FILM

[75] Inventors: Linda S. Plano, Redwood City; Michael G. Peters, Santa Clara; Kramadhati V. Ravi, Atherton; John M. Pinneo, Redwood City, all of Calif.

[73] Assignee: Crystallume, Santa Clara, Calif.

[*] Notice: The term of this patent shall not extend beyond the expiration date of Pat. No. 5,271,971.

[21] Appl. No.: 238,989

[22] Filed: May 5, 1994

Related U.S. Application Data

[63] Continuation of Ser. No. 59,711, May 10, 1993, abandoned, which is a continuation of Ser. No. 698,352, May 1, 1991, abandoned, which is a continuation of Ser. No. 260,887, Oct. 21, 1988, abandoned.

[51] Int. Cl.$^6$ .............................. C23C 16/26; H05H 1/24
[52] U.S. Cl. .......................... 427/249; 427/577; 427/255; 427/255.1; 427/122; 423/446
[58] Field of Search ................................ 427/249, 255, 427/255.1, 122, 577; 423/446; 428/408; 117/929

[56] References Cited

U.S. PATENT DOCUMENTS

| | | | |
|---|---|---|---|
| 3,828,190 | 8/1974 | Dahlin et al. | 250/308 |
| 4,178,509 | 12/1979 | More et al. | 250/374 |
| 4,393,127 | 7/1983 | Greschner et al. | 430/5 |
| 4,434,188 | 2/1984 | Kamo et al. | 427/39 |
| 4,486,286 | 12/1984 | Lewin et al. | 204/192 |
| 4,698,256 | 10/1987 | Giglia et al. | 428/216 |
| 4,734,339 | 3/1988 | Schachner et al. | 428/701 |
| 4,767,517 | 8/1988 | Hiraki et al. . | |
| 4,777,090 | 10/1988 | Ovshinsky et al. | 428/408 |
| 4,783,368 | 11/1988 | Yamamoto et al. | 428/408 |
| 4,809,876 | 3/1989 | Tomaswick et al. | 220/458 |
| 4,816,286 | 3/1989 | Hirose | 427/39 |
| 4,933,557 | 6/1990 | Perkins et al. | 250/501.5 |
| 4,940,015 | 7/1990 | Kobashi et al. | 427/39 |
| 5,225,275 | 8/1993 | Aida | 428/408 |
| 5,271,971 | 12/1993 | Herb et al. | 427/577 |

FOREIGN PATENT DOCUMENTS 0254312  7/1987  European Pat. Off. .

Primary Examiner—Roy V. King
Attorney, Agent, or Firm—D'Alessandro & Ritchie

[57] ABSTRACT

A continuous thin diamond film having a thickness of less than about 2 microns has a low leakage. The thin diamond film may be supported on a supporting grid and may be incorporated into an X-ray window. The film may be formed in a DC assisted CVD process where in a first phase a relatively high concentration of a carbonaceous gas is introduced into the reactor and in a second phase the concentration of the carbonaceous gas is reduced to a lower value.

1 Claim, 3 Drawing Sheets

METHOD FOR MAKING CONTINUOUS THIN DIAMOND FILM

RELATED APPLICATIONS

This application is a continuation of application Ser. No. 08/059,711, filed May 10, 1993 which is a continuation of application Ser. No. 07/698,352, filed May 1, 1991 which is a continuation of application Ser. No. 07/260,887, filed Oct. 21, 1988, all the three applications now abandoned.

BACKGROUND OF THE INVENTION

1. Field of the Invention

The present invention relates to thin diamond films. More specifically, the present invention relates to continuous thin diamond films, and methods for making continuous thin diamond films.

2. The Prior Art

Diamond films of a sort have been reported in the literature. However, continuous diamond films having thicknesses substantially less than 1 micron over large areas (i.e. 1 cm$^2$) appear to have been beyond the reach of the art. The reported methods for producing diamond films have included plasma enhanced chemical vapor deposition (CVD) techniques utilizing RF energy, microwave energy, direct current techniques or hot wire filament methods with or without plasma assist.

Methods for producing diamond films have included the decomposition of a hydrocarbon gas such as methane, in the presence of hydrogen, and the consequent formation of diamond crystals on a substrate material in a CVD reactor. The substrate materials have been first prepared, usually by mechanical polishing using diamond dust, in order to create suitable nucleation sites for the thin diamond film. Alternatively, thin diamond films have been epitaxially grown on existing diamond crystals. Metal substrates, as well as silicon and other semiconductor substrates, have been utilized.

A key uncertainty in the growth of diamond films has heretofore been success or not in nucleating diamond on a variety of substrates. Typically, in order to promote nucleation, the substrate has been abraded with diamond or silicon carbide powder so as to provide a high density of energetically favorable nucleation sites on the substrate surface. There are several drawbacks to this approach. Abrasion damages the substrate surface since the objective of abrasion is to provide locally damaged regions on the substrate to promote diamond film nucleation. Whereas this approach to film nucleation may be acceptable in those applications that are not influenced by the damaged regions on the substrate, in a majority of applications where the quality of the interface between the substrate and the diamond film is important, surface abrasion has not proven viable as an approach to the promotion of diamond film nucleation.

Where diamond films are to be used in conjunction with other semiconductors such as silicon or gallium arsenide for applications as capacitors, passivation layers, and heat transfer elements, the quality of the interface between the semiconductor and the diamond film is critical. Other potential applications where good interface properties are important include the diamond coating of infrared optical materials for protection against abrasion. In such cases the optical properties of the infrared materials may be compromised by the presence of a damaged layer at the interface.

In addition to mechanical damage at the interface, substrate preparation by the use of abrasives such as diamond or silicon carbide is likely to result in a contaminated surface, a feature that is also detrimental to the creation of high quality interfaces. Cleaning the surface following abrasion can reduce the effectiveness of the locally damaged regions by the saturation of dangling bonds by the cleaning agents. Finally, the process of abrasion is difficult to control and can be considered to be more art than science, with consequent unpredictability in application.

As a consequence, approaches for appropriately treating the surface of the substrate to enhance the nucleation of diamond crystals are needed.

The physical and electrical properties of the diamond form of carbon make it a candidate for numerous potentially exciting uses. Among these uses are as semiconductor and insulating films in electronic devices, and radiation windows useful in various scientific applications.

For instance, the study of X-ray spectra from light elements, including carbon, boron, nitrogen, and oxygen, requires a window material which will pass a sufficient number of X-ray photons from a sample to allow collection of meaningful data. Prior to the present invention, such windows have been fabricated from boron nitride, beryllium, and from certain polymer films.

While these materials have proved to be useful, each suffers from one or more drawbacks. For instance, the properties of boron nitride are such that windows larger than about 4 mm in diameter have generally not been practicable. In addition, boron nitride contains appreciable quantities of hydrogen, which contribute to its degradation over time.

Beryllium windows, which are the most commonly used today, apparently cannot be made thinner than about 8.0 microns without appreciable leakage. At thicknesses less vulnerable to such defects, such windows will not allow low energy X-rays from light elements such as carbon, oxygen, nitrogen and boron to pass through them. Consequently, X-rays from these elements cannot usefully be detected using beryllium windows. In addition, beryllium is easily subject to corrosion from exposure to even small amounts of water vapor in the laboratory environment.

Thin windows have been made using polymeric material, but these windows suffer from drawbacks. Polymer films, while not subject to water vapor corrosion, are subject to fatigue fracture after being repeatedly cycled between atmospheric pressure and the pressure used in X-ray analysis equipment.

To our eyes, the properties of diamond suggested to us that it could be an excellent candidate for a window material in the X-ray environment, especially for observation of X-ray spectra from the light elements. A thin diamond film can be expected to be corrosion resistant, and, if it could be properly fabricated, could have enough strength to withstand the stress of repeated pressure cycling encountered in X-ray analysis equipment. A thin diamond film, having a thickness of about 5,000 Å or less, will have an X-ray absorption fine structure which will allow passage of sufficient numbers of low-energy X-ray photons to enable it to be used as a window for X-ray instrumentation.

The prior art has apparently been unable to provide a continuous thin diamond film sufficiently thin (less than about 2 microns thick) to enable it to be employed in this and other applications. For certain applications, such a film must be sufficiently defect free so that it will have very poor permeability, viz., be a low-leakage material, and have sufficient strength to withstand both absolute pressure differentials and repeated pressure cyclings in the X-ray environment. These properties in a thin diamond film would also qualify it as a good candidate for other applications requiring high quality diamond thin films.

BRIEF DESCRIPTION OF THE INVENTION

A first aspect of the present invention is a thin diamond film. This film comprises polycrystalline diamond in a "continuous" (i.e., one piece) film having a thickness of less than about 2 microns. In a preferred embodiment, the thin diamond film of the present invention has a thickness of less than about 5,000 Å (0.5 microns). The thin diamond film of the present invention has a low permeability to helium, indicating that it is relatively leak free. The diamond films of the present invention have a permeability to helium lower than about $1 \times 10^{-6}$ and preferably lower than $1 \times 10^{-8}$ standard cubic centimeters per second per square millimeter of film area.

A presently preferred embodiment of the thin diamond film of the present invention is a two layer structure. In reverse order of formation, a first, top layer of polycrystalline diamond is grown over a second, bottom layer of microcrystalline diamond. The bottom layer of microcrystalline diamond is formed on a substrate material which may later be completely or partially removed, i.e., by etching using a selective etchant. Depending upon the application, the substrate may also be a tool or other structure upon which the diamond is placed as a coating.

In another aspect of the present invention, a window comprises a thin diamond film and is disposed on a supportive grid. Peripheral mounting means allows the thin diamond film window to be mounted in X-ray or other apparatus.

The thin diamond films of the present invention are fabricated according to yet another aspect of the present invention.

A substrate is placed into a CVD reactor apparatus. The substrate need not be prepared by mechanical abrasion with diamond dust or other abrasive. The substrate holder into which the substrate is placed has an electrical connection to a source of positive voltage.

A gas delivery system, spaced apart from the substrate holder anode, has an electrical connection to a source of negative voltage and thus acts as a cathode. The CVD reactor is assembled and sealed. Hydrogen gas is introduced into the reactor after the air is purged. A furnace surrounding the reactor is turned on. A voltage is supplied between the substrate holder and the gas delivery system.

When the temperature and pressure in the reactor have stabilized, methane gas or other reactant carbon-supplying gas is introduced into the reactor. During a first phase of deposition, a relatively high concentration of methane is used in a hydrogen atmosphere. After a predetermined period of time, the methane concentration is reduced, and a second phase of deposition proceeds with a lower reactant gas concentration for a period of time sufficient to achieve the desired thin diamond film thickness.

After the thin diamond film on the substrate has been removed from the CVD reactor, all or part of the substrate material may be removed by etching using a selective etchant. The substrate may be first masked using standard semiconductor processing techniques. A supportive grid may be mated with the finished thin diamond film, or a masking pattern may be used to produce a supportive grid for the thin diamond film for applications where physical strength and/or very thin film thickness are desired.

BRIEF DESCRIPTION OF THE DRAWINGS

The drawings in this application are not necessarily to scale.

DETAILED DESCRIPTION OF A PREFERRED EMBODIMENT

Figure 1:
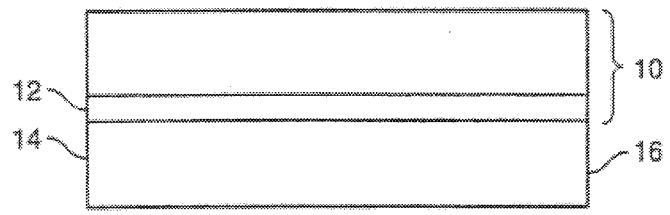
FIG. 1 is a cross-sectional view of a thin diamond film on a substrate according to the presently-preferred embodiment of the invention.

Referring first to FIG. 1, a thin diamond film 10, comprising a top layer 12 and a bottom layer 14, is disposed upon a substrate 16. Substrate 16 may be a metal, such as molybdenum, titanium, tungsten, zirconium or aluminum, a semiconductor material, such as silicon, germanium, or gallium arsenide, or other materials. Although FIG. 1 shows a flat substrate 16 with flat top and bottom layers 12 and 14, those of ordinary skill in the art will recognize from the disclosure herein that non—planar surfaces may also be coated with the thin diamond film coating of the present invention.

Top layer 12 of thin diamond film 10 is a layer of polycrystalline diamond film. Top layer 12 is deposited upon the surface of bottom layer 14, of microcrystalline diamond. This bottom layer 14 of microcrystalline diamond forms a large number of nucleation sites for top layer 12 of polycrystalline diamond. "Microcrystalline" herein shall mean crystals having average diameters lying between about 50 Å and about 3,000 Å. Bottom layer 14 provides the large number of nucleating sites on the surface of substrate 16 as a result of the performance of the process disclosed herein.

Thin diamond film 10 is a "continuous" film, meaning that it is a single piece of diamond film structure. It is a continuous film even at thicknesses less than 5,000 Å. Thin diamond film 10 is also a high quality film, essentially free from pinholes and other major structural defects at thicknesses of less than about 5,000 Å. Thin diamond film 10 is a low leakage material, having a permeability of lower than about $1 \times 10^{-6}$ standard cubic centimeters of helium per second per square millimeter of surface area.

The thin diamond films of the present invention exhibit these beneficial properties over film areas appreciably larger than one square millimeter. For example, these films have been successfully grown on silicon substrates 10 cm in diameter. These large area high quality diamond films may be employed as X-ray spectroscope windows, X-ray lithography mask membranes and in other applications.

Figure 2A:
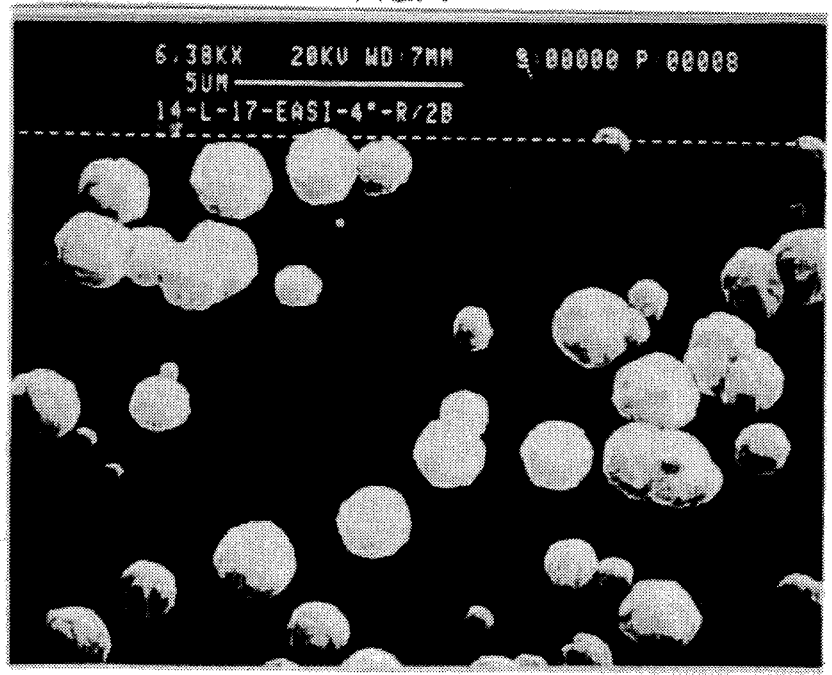
FIG. 2a and 2b are top views of a portion of an area of thin diamond films grown, respectively, using a prior art technique and using the process of the present invention.

FIG. 2a is a photomicrograph which illustrates the typical crystal structure of CVD diamond deposited to a thickness of approximately 1–2 microns using single phase processes known in the prior art. The structure is characterized by individual crystals, some of which have coalesced as they have grown. Such a structure will not form a continuous film until it reaches a minimum thickness of about 3 microns. Diamond films grown over substrates prepared by mechanical abrasion will coalesce into continuous films at thicknesses around 0.8 microns, but will have poor leakage characteristics until substantially thicker.

Figure 2B:
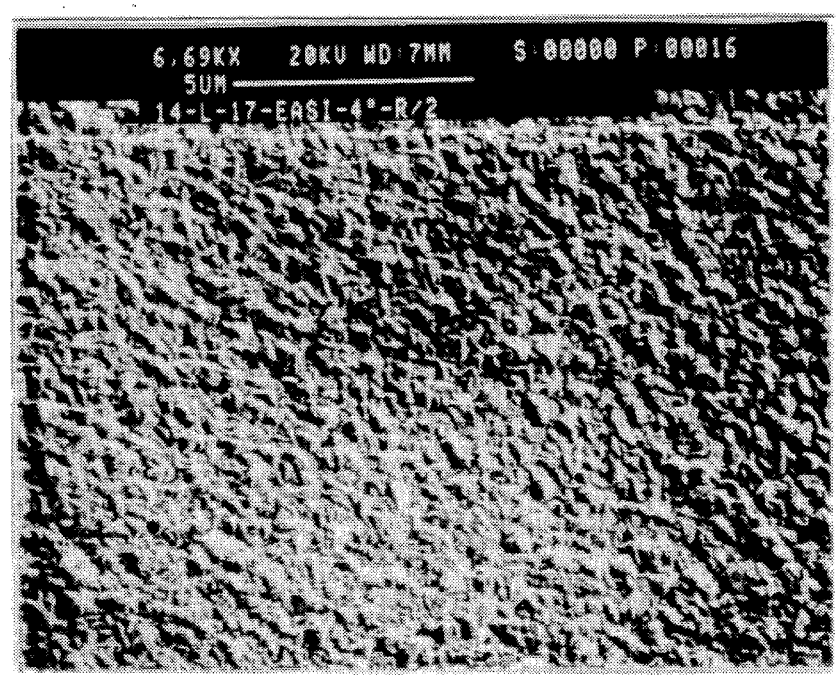

FIG. 2b is a photomicrograph which illustrates the typical crystal structure at the surface of a continuous thin diamond film made according to the present invention. Continuous films as thin as 2,000 Å (0.2 micron) have been successfully grown using the process of the present invention.

Figure 3:
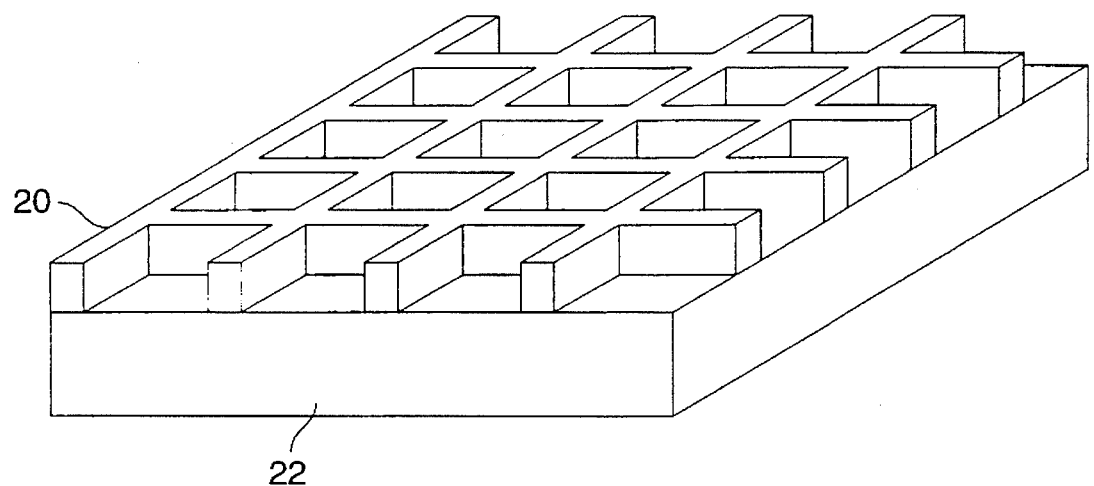
FIG. 3 is an isometric view of a thin diamond film on a supportive grid suitable for use in an X-ray window according to one embodiment of the present invention.

Referring now to FIG. 3, supportive grid 20 is shown in contact with thin diamond film 22. In a presently-preferred embodiment, supportive grid 20 may be a silicon grid about 0.025 inches thick, having slots about 0.004 inches wide, spaced at intervals of about 0.0015 inches, upon which a thin diamond film 22 may be supported. Alternatively, supportive grids 20 may be fabricated from other materials, such as a drilled metal sheet. This composite structure is useful in applications where the thin diamond film 22 is too thin to be free-standing for the forces which will be applied to it during use. For example, the thin diamond films of the present invention find use as X-ray spectrograph windows suitable for use for observing low energy X-ray spectra from the light elements (boron, carbon, nitrogen, and oxygen). In such applications, the thin diamond film 22 has a thickness of about 5,000 Å or less, and the pressure differential which will be encountered across the window is such that a supportive grid 20 may be necessary.

The silicon supportive grid 20 of a presently-preferred embodiment may be fabricated by standard semiconductor masking and etching techniques, and is later mated with a thin diamond film 22 from which the silicon substrate on which it has been deposited has been removed in a standard semiconductor $HF/HNO_3$ etchant.

The silicon substrate layer upon which the thin diamond film has been grown may be etched using standard semiconductor masking and etching techniques to form the supportive grid 20 on the surface of thin diamond film 22 of FIG. 3.

When the thin diamond film of the present invention is used in an application such as an X-ray spectroscopy window, some mounting means should be provided at the periphery of the window for attaching it to the spectroscopy equipment. A presently-preferred mounting means is an aluminum ring. A completed window including such mounting means is shown in FIG. 4.

The aluminum ring may have a flange in its internal diameter into which the thin diamond film window material may be placed. The flange may be coated with an appropriate sealant as disclosed herein and the thin diamond film placed over the bead of sealant. When the diamond film is in place, more sealant may be applied. Alternatively, the thin diamond film may be fastened between two rings with sealant.

Other mounting means are contemplated as within the scope of the present invention. For example, a peripheral diamond land which is thick relative to a central lens portion of a thin film diamond window may be formed by selectively etching an originally thick diamond film disc. Other mounting means will readily suggest themselves to those of ordinary skill in the art.

Figure 4:
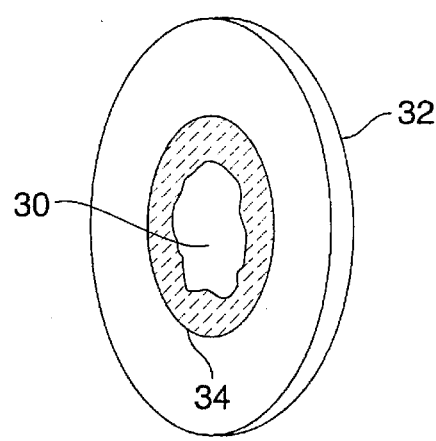
FIG. 4 is an isometric view of the structure of FIG. 3 incorporated into an X-ray window including peripheral mounting means.

Referring now to FIG. 4, an X-ray window assembly is shown including a thin diamond film, disposed upon a supportive grid, shown at reference numeral 30, mounted within a circular aluminum ring 32. The diamond film and grid 30 are attached to ring 32 by use of a vacuum-compatible adhesive and sealant 34 which may be a two-part epoxy suitable for high vacuum sealing. Such a sealant 34 should be able to produce an X-ray window having a helium permeability of lower than $1\times10^{-6}$ standard cubic centimeters per second per square millimeter of surface areas and preferably lower than $1\times10^{-8}$ ssccm/sec/mm². Torrseal, available from Varian Corp. in Lexington, Mass., has been found to be satisfactory for this purpose as has Armstrong C-4 with D activator, available from Armstrong products in Warsaw, Indiana.

The thin diamond film of the present invention may be made by a novel direct-current-assisted chemical vapor deposition process. This process may be carried out in a tubular CVD reactor which will be disclosed in connection with FIG. 5, although those of ordinary skill in the art may be able to use other apparatus without departing from the spirit of the invention.

Figure 5:
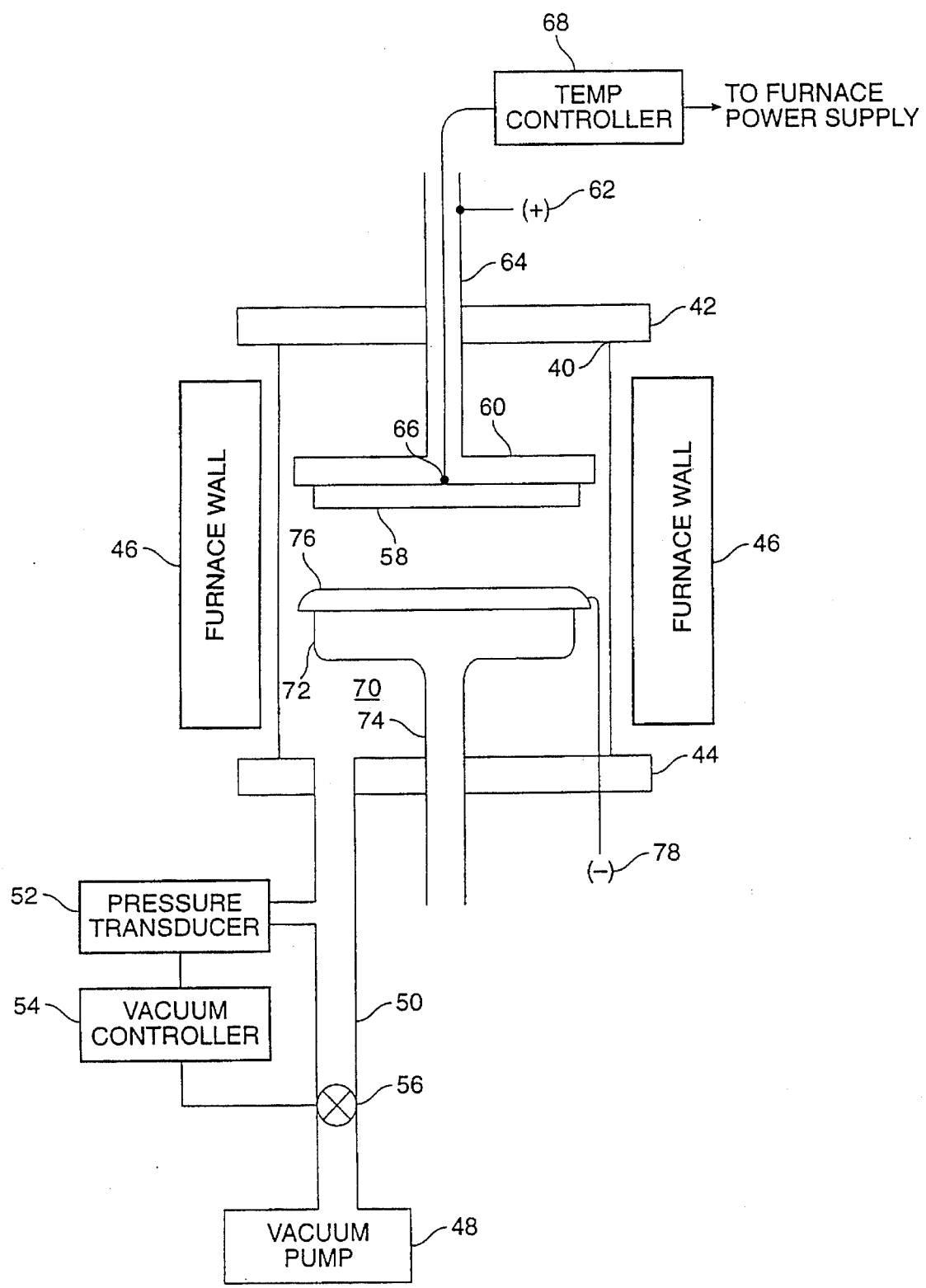
FIG. 5 is a diagram of a DC-plasma-assisted CVD reactor suitable for producing thin diamond films according to a presently preferred embodiment of the invention.

Referring now to FIG. 5, a tubular CVD reactor suitable for carrying out the process of the present invention is depicted. The tubular reactor vessel 40, which may be fabricated from quartz as is known in the art, has upper flange 42 and lower flange 44, which may both be assembled onto reactor vessel 40 and vacuum sealed. Reactor vessel 40 may be surrounded by a clam-shell or split-shell furnace. The walls of the furnace are shown diagrammatically at reference numeral 46.

A vacuum pump 48 communicates with the inside of reactor vessel 40 via a line 50 which passes through lower flange 44. Pressure transducer 52 communicates with line 50 and drives vacuum controller 54, which, in turn, drives valve 56. Pressure transducer 52, vacuum controller 54 and valve 56 together form a feedback loop in the conventional manner for maintaining a selected level of pressure inside of reactor vessel 40.

A substrate 58, onto which the thin diamond film will be deposited, is held on substrate holder 60 which is electrically connected to a source of positive voltage (shown by the + sign at reference numeral 62) via a member 64, which passes through upper flange 42. A thermocouple 66 is placed in contact with substrate 58 and is electrically coupled to temperature controller 68. The feedback loop including thermocouple 66 and temperature controller 68 is well known and controls the power supply (not shown) of the furnace to maintain the desired substrate temperature in the conventional manner.

A gas delivery system includes a gas delivery vessel 70, which has a plenum portion 72 and a line portion 74. Gas delivery vessel 70 may be made from quartz. The depth of plenum portion 72 is selected to assure uniform gas distribution across the substrate 58 surface. For a four inch substrate 58 in a six inch diameter reactor vessel 40, a depth of 1.75 inches has been found to be satisfactory. Plenum portion 72 is covered by gas delivery nozzle 76. Gas delivery nozzle 76 is electrically connected to a source of negative voltage (shown by the minus or "–" sign at reference numeral 78).

Gas delivery nozzle 76 may be made from vacuum compatible materials, and is preferably molybdenum. It has a plurality of holes through it for delivering a uniform flow of reactant gasses into reactor vessel 40 and to the surface of substrate 58. The size and spacing of the holes will affect the operation of the process. Holes which are too large will cause the hollow cathode effect, and holes which are too small will be difficult to machine and will require undesirably high pressure gas sources. Holes about 0.015 inches in diameter, placed in a hexagonal close packed array pattern about 0.170 inches on a side have been found to be adequate for use in the present invention. The hexagonal pattern should extend over an area slightly larger than that of the substrate in order to eliminate edge effects in the deposition.

Before commencing the process, the substrate 58 is secured to the substrate holder 60 and in contact with the thermocouple 66. The flanges 42 and 44 are then sealed to the reactor vessel 40. The vacuum pump 48 is started, the furnace is turned on, and the flow of the hydrogen gas hydrogen is started.

In a presently-preferred embodiment, after the pressure has stabilized to about 25 Torr and the temperature has stabilized to between about 300° and about 725° C., about 725° C. being presently preferred (higher temperatures are believed to cause larger crystal grain size and/or the formation and incorporation of graphite), the voltage supply connected to the electrodes 62 and 78 is turned on to initiate the plasma.

The total power supplied is preferably from about 200 to about 450 watts, at a typical voltage of about 300 v, at a current of between about 0.75 and about 1.5 amps. The current is controlled, leaving the voltage as a derivative parameter. Current density at the substrate should be sufficiently high that acceptable growth rates are obtained but less than that at which nucleation density becomes too sparse to form the fully-coalesced or continuous films of the desired thickness because of the formation of large individual crystals. For a 4 inch substrate, it is believed that the current should be less than about 3 amps. After the temperature has again stabilized, the methane gas flow is started.

Gas delivery flow rates appropriate for the present invention should lie between upper and lower limits. The lower limit of gas delivery flow rate is set by a practical determination based upon the desire to obtain a reasonable deposition duration. For example, it is believed that a flow rate of 10 sccm or less would result in an unduly long deposition duration for production of films on a 4 inch substrate. The upper limit is determined by film quality. It is believed that rates of 500 sccm or higher will give rise to undesirable structures on a 4 inch substrate.

Total gas pressure should be sufficiently high that a stable DC plasma can be initiated and sustained between the substrate 58 and the gas delivery nozzle 76, but not so high that super-heating of the gas deliverly nozzle 76 occurs due to ion bombardment with the consequent formation of graphite.

In a presently-preferred embodiment, a total gas flow rate of about 100 sccm has been found to be satisfactory. It is critical that the deposition of the thin diamond film be carried out in two phases, supply of the gaseous carbon source during the first phase occurring under conditions sufficient to ensure deposition of microcrystalline diamond, so that nucleation appropriate to attainment of the objective of the invention is achieved. In a presently-preferred embodiment, the first phase is carried out for a period of about 4 hrs. In the first phase the gas mixture supplied to the reactor is between 2% and 5% by volume of $CH_4$ (methane). In a presently-preferred embodiment, 5% methane by volume is used. Other gaseous hydrocarbon compounds such as ethylene, ethane, benzene, etc., can be used. In addition, nonhydrocarbon carbon sources such as carbon monoxide and other similar compounds such as carbon disulphide may be used.

It has been found that gas purity effects pinhole defect density. Consequently, methane gas having fewer than 5 ppm of nitrogen should be used. During the first phase, the current in a preferred embodiment is set at about 680 mA to achieve a current density on the substrate of 9 $mA/cm^2$ assuming a four inch silicon wafer substrate having about 6 $cm^2$ masked off by the substrate holder.

After the first phase, a second phase is initiated in which the methane flow rate is decreased to about less than about 0.2% by volume and the current density increased to greater than 10 $mA/cm^2$ of substrate area. This is about 750 mA for a 4 inch silicon wafer.

The second phase is carried out for a time sufficient to achieve the desired end thickness. Using the preferred process parameters, the deposition rate during the second phase will be about 60 Å/hr.

What is claimed is:

1. A process for making a continuous thin diamond film, comprising the steps of:

placing a substrate in a CVD reactor, creating a vacuum in the CVD reactor, raising the temperature of the CVD reactor to between about 300°–275° C., introducing hydrogen into the CVD reactor, during a first phase introducing about 2–5% by volume of a carbonaceous gas into the CVD reactor, to ensure formation of diamond nucleation, and during a second phase following said first phase reducing the concentration of the carbonaceous gas to about 0.2% by volume to achieve the desired end thickness of the continuous thin diamond film.

* * * * *

UNITED STATES PATENT AND TRADEMARK OFFICE
CERTIFICATE OF CORRECTION

PATENT NO. : 5,607,723
DATED : March 4, 1997
INVENTOR(S) : Linda S. Plano, Michael G. Peters, Kramadhati V. Ravi, John M. Pinneo It is certified that error appears in the above-indentified patent and that said Letters Patent is hereby corrected as shown below:

In col. 4, line 32, please replace "non---planar" with --non-planar--.

In col. 5, line 58, please replace "land" with --band--.

In col. 7, line 10, please delete "hydrogen".

Signed and Sealed this

Eighth Day of July, 1997

Attest:

BRUCE LEHMAN

*Attesting Officer*    *Commissioner of Patents and Trademarks*